United States Patent
Twu et al.

(10) Patent No.: US 6,503,333 B2
(45) Date of Patent: Jan. 7, 2003

(54) METHOD FOR CLEANING SEMICONDUCTOR WAFERS WITH OZONE-CONTAINING SOLVENT

(75) Inventors: Jih-Churng Twu, Chung-Ho (TW); Rong-Hui Kao, Hsinchu (TW); Chia-Chun Cheng, Tainan (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 139 days.

(21) Appl. No.: 09/726,628

(22) Filed: Nov. 30, 2000

(65) Prior Publication Data

US 2002/0062841 A1 May 30, 2002

(51) Int. Cl.[7] .................................................. C23G 1/02
(52) U.S. Cl. ............................... 134/3; 134/2; 134/25.4; 134/26; 134/28; 134/29; 134/30; 134/34; 134/33; 134/36; 134/41; 134/902; 510/175
(58) Field of Search .............................. 134/2, 3, 25.4, 134/26, 28, 32, 29, 30, 34, 36, 41, 902, 33; 510/175

(56) References Cited

U.S. PATENT DOCUMENTS

| | | | | | |
|---|---|---|---|---|---|
| 5,679,171 | A | * | 10/1997 | Saga et al. ...................... | 134/2 |
| 5,853,491 | A | * | 12/1998 | Schulz ............................ | 134/1 |
| 6,146,467 | A | * | 11/2000 | Takaishi et al. ................ | 134/2 |
| 6,165,279 | A | * | 12/2000 | Tsao et al. ...................... | 134/2 |
| 6,230,720 | B1 | * | 5/2001 | Yalamanchili et al. ....... | 134/1.3 |
| 6,319,331 | B1 | * | 11/2001 | Kume et al. .................... | 134/2 |

* cited by examiner

*Primary Examiner*—Sharidan Carrillo
(74) *Attorney, Agent, or Firm*—Tung & Associates

(57) ABSTRACT

A method for cleaning a silicon wafer by a wet bench method with improved cleaning efficiency and without oxide formation is disclosed. In the method, the wafer may first be cleaned in a first cleaning solution that includes a base or an acid, and then the wafer is rinsed in a second solution that includes DI water and ozone. The ozone concentration in the DI water may be between about 1 ppm and about 20 ppm, and preferably between about 3 ppm and about 10 ppm. A diluted HF cleaning step may be utilized after the ozone/DI water rinsing step to remove any possible oxide formation on the silicon surface before a final rinsing step and drying step.

9 Claims, 1 Drawing Sheet

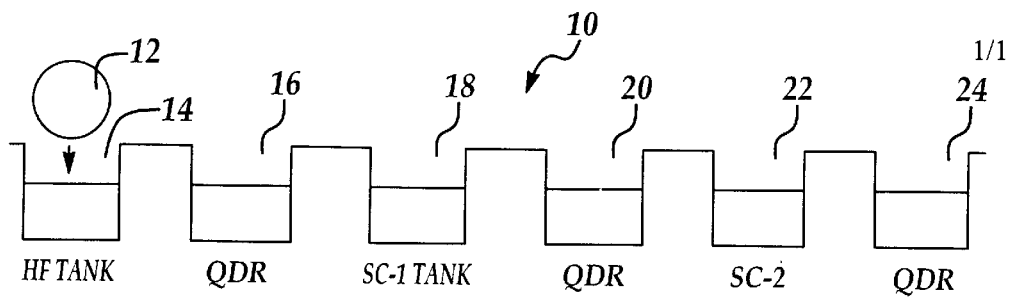
*Figure 1*
*Prior Art*
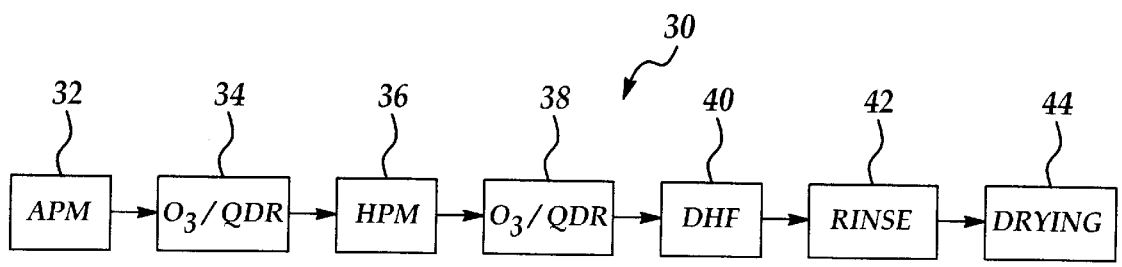
*Figure 2*
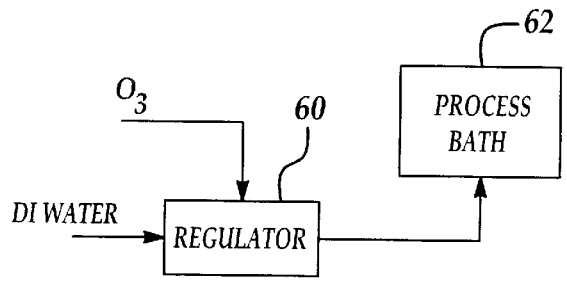
*Figure 3*
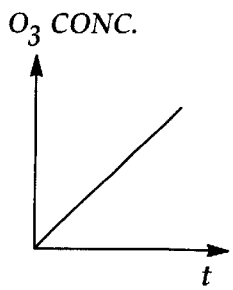 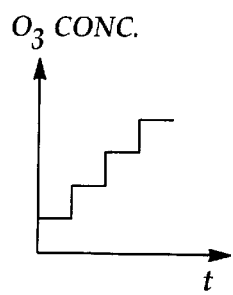 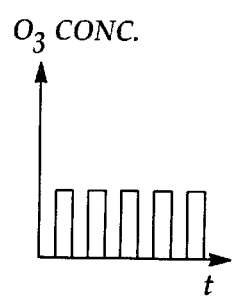
*Figure 4A*   *Figure 4B*   *Figure 4C*

METHOD FOR CLEANING SEMICONDUCTOR WAFERS WITH OZONE-CONTAINING SOLVENT

FIELD OF THE INVENTION

The present invention generally relates to a method for cleaning semiconductor wafers and more particularly, relates to a method for cleaning semiconductor wafers with ozone-containing solvent.

BACKGROUND OF THE INVENTION

In the manufacture of semiconductor devices, a large quantity of deionized (DI) water is required to process silicon wafers. The consumption of DI water increases with the size of the wafers. For instance, the consumption at least doubles in the processing of 200 mm size wafers when compared to the consumption in the processing of 150 mm size wafers. DI water is most frequently used in tanks and scrubbers for the frequent cleaning and rinsing of wafers in process. It is desirable that the surface of a wafer be cleaned by DI water after any process has been conducted on the wafer, i.e., oxide deposition, nitride deposition, SOG deposition or any other deposition or etching process. Such wafer cleaning step is accomplished by equipment that are installed either in-line or in a batch-type process.

For instance, a cassette-to-cassette wafer scrubbing system is one of the most used production systems for wafer cleaning prior to either a photoresist coating, oxidation, diffusion, metalization or CVD process. A typical automated wafer scrubber combines brush and solution scrubbing by DI water. The scrubber utilizes a hyperbolic high pressure spray of DI water with a retractable cleaning brush. A typical mechanical scrubbing process consists of rotating a brush near a wafer surface that is sprayed with a jet of high pressure DI water at a pressure between about 2,000 and about 3,000 psi. The brush does not actually contact the wafer surface, instead, an aquaplane is formed across the wafer surface which transfers momentum to the DI water. The movement of the DI water thus displaces and dislodges contaminating particles that have been deposited on the wafer surface. Contaminating particles are thus removed by a momentum transfer process. As a result, larger particles become more difficult to dislodge and remove from a wafer surface.

A typical wafer scrubbing process consists of a DI water spray step followed by a spin dry and nitrogen gas blow dry step. In a typical wafer scrubbing equipment, production rates are generally between 60 to 120 wafers per hour depending on the program length. The spinning speed of the wafer is between 500 to 10,000 rpm while under a water pressure of up to 6,000 psi.

In more recently developed wafer scrubbing systems, in-line systems are used which provide high pressure DI water scrubbing only while eliminating the possibility of wafer contamination by overloaded brushes. The water pressure in these systems range between 3,000 to 6,000 psi which are ejected from a nozzle mounted on an oscillating head. The wafer is spun when the oscillating spray is directed onto the wafer surface. After the cleaning step, wafer is dried by a pure nitrogen gas purge to promote rapid drying. After the scrubbing operation, wafers can be loaded into an in-line dehydration baking system for thorough drying. Batch-type systems are also used with DI water for cleaning, rinsing and drying prior to many IC processes. The systems can be programmed wherein wafers are loaded in cassettes before each cycle. One disadvantage of the batch system is their inability to be integrated into part of an automated wafer processing line.

In the conventional DI water cleaning systems, the basic requirements for the DI water cleaning system are that it provides a continuous supply of ultra-clean water with very low ionic content. It is believed that ionic contaminants in water, such as sodium, iron or copper when deposited onto a wafer surface can cause device degradation or failure. It is therefore desirable to eliminate all such ionic content from a DI water supply prior to using the water for cleaning wafers. A conventional method of measuring the ionic content in DI water is by monitoring the water resistivity. A water resistivity of $18 \times 10^6$ Ohm-cm or higher indicates a low ionic content in the DI water. In a conventional water purifying system, several sections which include charcoal filters, electrodialysis units and a number of resin units to demineralize the water are used for purifying the water.

Deionized water is frequently used in a wet bench process after a metal etching process has been conducted on a semiconductor wafer. When residual etchant chemical must be removed, deionized water rinse is used in a wet bench process for semiconductor wafer processing to perform two major functions of a quick dump rinse (QDR) and a cascade overflow rinse. Conventionally, the two functions are carried out in separate tanks in order to produce the desirable result. One of the major processing issues presented by the conventional dual-tank process is the particle re-deposition problem during a withdrawal step when cassettes are transported from a quick dump rinse tank to a cascade overflow tank. A second major issue is the large floor space required for accommodating the two tanks.

A conventional wet bench wafer cleaning process is shown in FIG. 1. The wet bench wafer cleaning process 10 for cleaning wafer 12 is carried out in six separate cleaning and rinsing tanks sequentially of a HF cleaning tank 14, a first quick dump rinse (QDR) tank 16, a SC-1 cleaning tank 18, a second quick dump rinse tank 20, a SC-2 cleaning tank 22 and a third quick dump rinse tank 24. The first HF cleaning tank is used to hold a diluted HF solution, for instance, at a concentration of 0.5% HF in $H_2O$ for removing a thin native oxide layer from the wafer surface. After the diluted HF cleaning process, the wafer 12 is rinsed in a first quick dump rinse tank 16 with deionized water. Wafer 12 is then cleaned in a second cleaning tank filled with SC-1 cleaning solution, i.e. a mixture of $NH_4OH$, $H_2O_2$ and DI water at a ratio of 1:1:5. The SC-1 cleaning solution is used at a temperature between 70~80° C. for a suitable time period. The wafer 12 is then rinsed again in a second quick dump rinse tank 20 that is filled with DI water. In the final stage of cleaning, the wafer 12 is cleaned in tank 22 filled with a cleaning solution of SC-2 which is a mixture of HCl, $H_2O_2$ and DI water at a ratio of 1:1:6. The wafer 12 is then rinsed in a third quick dump rinse tank 24 with DI water.

The wet bench wafer cleaning process 10 shown in FIG. 1 is conventionally used for pre-diffusion clean, pre-gate oxidation clean, pre-CVD clean, etc. For instance, in the ULSI fabrication of integrated devices, the conventional wet bench wafer cleaning process 10 can be advantageously used for wafer surface cleaning before a coating process in a CVD chamber or an oxidation process in a furnace.

Recently, ozone-injected ultrapure water has been used in the semiconductor fabrication industry to remove organic contaminants on a silicon surface that are caused by organic vapors in the ambient, or the residue of photoresist material. It has been discovered that when ozone is dissolved in ultrapure water, it decomposes and becomes a strong oxidizing agent that decomposes organic impurities. The ozone-injected ultrapure water cleaning process has the advantages of lower operating temperature, simplicity in operation, and reduced chemical consumption. One drawback of the ozone-injected ultrapure water cleaning process is that it causes the growth of native oxide on the silicon wafer surface due to the oxidizing effect of ozone. The growth of the oxide thickness increases as the immersion time in the ozone-injected water increases. The oxide thickness further increases with the concentration of ozone. Hence, even though the ozone-injected ultrapure water is an effective cleaning method for removing organic residue from a silicon surface, it cannot be integrated into a total wafer wet cleaning process unless and until the oxide growth issue can be resolved.

It is therefore an object of the present invention to provide a method for cleaning a semiconductor wafer by wet bench that does not have the drawbacks or shortcomings of the conventional wet bench process.

It is another object of the present invention to provide a method for cleaning a semiconductor wafer that incorporates an ozone cleaning step without incurring the oxide growth problem.

It is a further object of the present invention to provide a method for cleaning a silicon wafer by a wet bench method incorporating ozone dissolved in deionized water (DI water).

It is another further object of the present invention to provide a method for cleaning a silicon surface by a RCA cleaning cycle incorporating rinsing steps with ozone dissolved in deionized water.

It is still another object of the present invention to provide a method for cleaning a silicon surface in a RCA cleaning cycle, rinsed by DI water containing ozone, and then cleaned by diluted HF for removing any oxide layer formed on the silicon surface.

It is yet another object of the present invention to provide a method for cleaning a silicon surface in a multi-bath process that includes SC-1 and SC-2 cleaning steps followed by a rinsing step utilizing ozone dissolved in DI water.

It is still another further object of the present invention to provide a method for cleaning a silicon surface in a multi-bath process in which the surface is first cleaned by a cleaning solution containing $NH_4OH$, rinsed by DI water containing $O_3$, cleaned by a second cleaning solution containing HCl, and rinsed by DI water containing $O_3$.

SUMMARY OF THE INVENTION

In accordance with the present invention, a method for cleaning a silicon surface in a multi-bath process incorporating the step of rinsing by DI water containing ozone is disclosed.

In a preferred embodiment, a method for cleaning a semiconductor wafer can be carried out by the operating steps of cleaning the wafer in a first tank by a first solution which includes a base or an acid; and cleaning the wafer in a second tank by a second solution that includes DI water and between about 1 ppm and about 20 ppm ozone.

The method for cleaning a semiconductor wafer may further include a rinsing step after the cleaning step, or a rinsing step by DI water after the cleaning step. The second solution may include preferably between about 3 ppm and about 10 ppm ozone. The first solution may include ammonium hydroxide or hydrochloric acid. The first solution may include $NH_4OH$, $H_2O_2$ and $H_2O$. The first solution may further include HCl, $H_2O_2$ and $H_2O$. The second solution may include DI water and ozone, the second solution may further include diluted HF and ozone. The method may further include the step of cleaning the wafer by a second solution in a quick-dump-rinse operation, or in a cascade overflow rinse operation.

The present invention is further directed to a method for cleaning a semiconductor wafer in a multi-bath process which can be carried out by the operating steps of exposing the semiconductor wafer to a first cleaning solution that includes $NH_4OH$; rinsing the semiconductor wafer by a first rinsing solution including $O_3$; exposing the semiconductor wafer to a second cleaning solution including HCl; rinsing the semiconductor wafer by a second rinsing solution including $O_3$; and drying the semiconductor wafer.

The method for cleaning a semiconductor wafer in a multi-bath process may further include the steps of, after the rinsing by the second rinsing solution and prior to the drying step, exposing the semiconductor wafer to a third cleaning solution including diluted HF; and rinsing the semiconductor wafer by a third rinsing solution of DI water. The method may further include the step of exposing the semiconductor wafer to a first cleaning solution that includes $NH_4OH$, $H_2O_2$ and DI water, or the step of exposing the semiconductor wafer to a second cleaning solution including HCl, $H_2O_2$ and DI water. The method may further include the step of rinsing the semiconductor wafer by the first and the second rinsing solution that includes between about 1 ppm and about 20 ppm ozone, or preferably includes between about 3 ppm and about 10 ppm ozone. The method may further include the step of exposing the semiconductor wafer to the third cleaning solution that includes less than 1 vol. % HF in DI water, or the step of drying the semiconductor wafer by a spin drying technique, or the step of drying the semiconductor wafer by an IPA vapor drying technique.

BRIEF DESCRIPTION OF THE DRAWING

These and other objects, features and advantages of the present invention will become apparent from the following detailed description and the appended drawings in which:

FIG. 1 is an illustration of a conventional multi-bath RCA cleaning cycle.

FIG. 2 is a block diagram illustrating the present invention multi-bath cleaning method incorporating ozone in the quick-dump-rinse step.

FIG. 3 is a block diagram illustrating the present invention method of adding ozone to DI water through a flow regulator to control the ozone concentration.

FIGS. 4A, 4B and 4C are graphs illustrating methods that ozone may be added to the present invention rinse step by a continuous increase, by a step increase or by a pulse injecting method.

DETAILED DESCRIPTION OF THE PREFERRED EMBODIMENT

The present invention discloses a method for cleaning a semiconductor wafer that has a silicon surface by first cleaning the wafer in a solution that contains a base or an acid, and then rinsing the wafer surface in a solution that contains DI water and ozone. The ozone content in the DI water may be suitably between about 1 ppm and about 20 ppm, and preferably between about 3 ppm and about 10 ppm ozone. The base or the acid contained in the first cleaning solution may be ammonium hydroxide or hydrochloric acid. The first cleaning solution may be a SC-1 or SC-2 solution used in a RCA cleaning cycle. When such is the case, the first solution may have a composition of $NH_4OH$, $H_2O_2$ and $H_2O$, while the second cleaning solution may have a composition of HCl, $H_2O_2$ and $H_2O$.

The rinsing step in the present invention novel method that utilizes ozone dissolved in DI water may be carried out in a quick-dump-rinse operation, or in a cascade overflow rinse operation.

When typical RCA cleaning solutions are utilized, the SC-1 (or APM solution) may contain $NH_4OH$, $H_2O_2$ and $H_2O$ in a volume ratio of 1:1:5. The SC-2 (or HPM solution) may contain HCl, $H_2O_2$ and $H_2O$ in a volume ratio of 1:1:6.

The present invention novel cleaning method may be carried out in a multi-bath process in which a wafer is first exposed to a first cleaning solution that includes $NH_4OH$; the wafer is then rinsed by a solution that contains $O_3$; the wafer is then exposed to a second cleaning solution that includes HCl; the wafer is then rinsed again by a second rinse solution that contains $O_3$; and then the wafer is dried. Alternatively, a diluted HF (hydrochloric acid) may be used as the third cleaning solution for cleaning the wafer surface after the second rinsing operation for removing any possible silicon oxide layer grown on the silicon surface by the ozone content in the rinsing solution. After the diluted HF cleaning, the wafer surface is again rinsed by DI water, before it is dried. The wafer, after the cleaning and rinsing operations may be dried by any conventional drying technique such as spin drying or IPA vapor drying.

Referring now to FIG. 2, wherein a block diagram of the present invention novel method of a multi-bath cleaning for a silicon wafer is shown. The process 30 is started by a first cleaning step 32 by a first cleaning solution of SC-1, or APM solution that consists of $NH_4OH$, $H_2O_2$ and $H_2O$. After the first immersion cleaning process, the wafer surface is rinsed in a quick-dump-rinse operation 34 wherein DI water that contains ozone is used. The ozone content in the DI water may be suitably controlled in-between about 1 ppm and about 20 ppm, and preferably between about 3 ppm and about 10 ppm. The control of the ozone concentration in DI water is shown in FIG. 3 by a regulator 60 before the ozone/DI water mixture is flown to a process bath 62 for the rinsing operation.

In the next step of the process, as shown in step 36, the silicon wafer surface is exposed to a SC-2 solution that contains HCl, $H_2O_2$ and $H_2O$. The standard RCA cleaning solutions of SC-1 (standard cleaning 1) and SC-2 (standard cleaning 2) are well-known in the industry wherein the solutions are normally used at a temperature between about 70° C. and about 80° C. The term "about" as used in this writing indicates a range of values that is ±10% from the average value given. The SC-1 cleaning solution has a high pH value and therefore can be used to remove organic contamination and particles by an oxidation reaction. The SC-2 cleaning solution has a low pH value and therefore can desorb metal contaminants by forming a soluble complex.

After the second SC-2 cleaning step 36, the wafer surface is again rinsed in a quick-dump-rinse step 38 that utilizes ozone dissolved in DI water. The ozone content in the DI water is similar to that used in the rinsing step 34. It should be noted that while the quick-dump-rinse operation is illustrated in the present invention FIG. 2, other rinsing steps, for instance, the cascade overflow rinsing operation, may be used to produce equally satisfactory results. After the second rinsing step 38, the present invention novel cleaning method further incorporates the step of surface cleaning by diluted hydrofluoric acid, as shown in step 40. The diluted hydrofluoric acid, or DHF, cleaning may be carried out by a diluted solution of HF in water. For instance, the diluted hydrofluoric solution may contain less than 1 vol. % of HF, or preferably contains about 0.5 vol. % of HF in water. The DHF cleaning step 40 effectively removes any possible silicon oxide layer that is thin enough, i.e. about 5~20 Å thickness, formed on the silicon surface. The present invention novel rinsing step utilizing ozone-injected into DI water can therefore be effectively carried out by incorporating the DHF cleaning step to remove any possible oxide formation. By incorporating the ozone/DI water rinsing step, the cleaning efficiency, and specifically the organic contaminants cleaning efficiency can be significantly improved on the silicon wafer surface.

Following the DHF cleaning step 40, a water rinsing step 42 may be performed to remove any residual HF left on the wafer surface. The wafer is then dried in a drying step 44 by utilizing any of the suitable drying methods such as spin drying, or IPA vapor drying.

As shown in FIG. 3, the present invention novel rinsing step utilizing ozone dissolved, or injected into DI water can be suitably controlled by regulator 60 to reach a suitable concentration of ozone in water. The step of dissolving ozone in water may be carried out by different manners such as those shown in FIGS. 4A, 4B and 4C. The ozone may be continuously injected into DI water such that the ozone concentration continuously increases with time, this is shown in FIG. 4A. The ozone may be injected into DI water in a step manner to gradually increase the ozone concentration in DI water, as shown in FIG. 4B. The ozone may further be injected into DI water in a pulse manner such that the on/off injection of ozone into DI water can be maintained at a constant level of ozone and therefore, the ozone concentration in DI water does not change. This is shown in FIG. 4C. It should be noted that any one of the three ozone injection methods into the DI water can be utilized to produce the same desirable result of the present invention novel method.

The present invention novel method for cleaning a semiconductor wafer in a multi-bath process utilizing a rinsing step of DI water with ozone has therefore been amply described in the above description and in the appended drawings of FIGS. 2~4C.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for cleaning a semiconductor wafer in a multi-bath process comprising the sequential steps of:

exposing said semiconductor wafer to a first cleaning solution comprising $NH_4OH$;

rinsing said semiconductor wafer by a first rinsing solution comprising $O_3$;

exposing said semiconductor wafer to a second cleaning solution comprising HCl;

rinsing said semiconductor wafer by a second rinsing solution comprising $O_3$; and drying said semiconductor wafer.

2. A method for cleaning a semiconductor wafer in a multi-bath process according to claim 1 further comprising the steps of, after said rinsing by said second rinsing solution and prior to said drying step:

exposing said semiconductor wafer to a third cleaning solution comprising diluted HF; and rinsing said semiconductor wafer by a third rinsing solution of DI water.

3. A method for cleaning a semiconductor wafer in a multi-bath process according to claim 1 wherein said first cleaning solution comprises $NH_4OH$, $H_2O_2$ and DI water.

4. A method for cleaning a semiconductor wafer in a multi-bath process according to claim 1 wherein said second cleaning solution comprises HCl, $H_2O_2$ and DI water.

5. A method for cleaning a semiconductor wafer in a multi-bath process according to claim 1 further comprising the steps of rinsing said semiconductor wafer by said first and said second rinsing solution that comprises between about 1 ppm and about 20 ppm ozone$(_3)$.

6. A method for cleaning a semiconductor wafer in a multi-bath process according to claim 1 further comprising the steps of rinsing said semiconductor wafer by said first and said second rinsing solution that preferably comprises between about 3 ppm and about 10 ppm ozone ($O_3$).

7. A method for cleaning a semiconductor wafer in a multi-bath process according to claim 1 further comprising the step of drying said semiconductor wafer by a spin-drying technique.

8. A method for cleaning a semiconductor wafer in a multi-bath process according to claim 1 further comprising the step of drying said semiconductor wafer by an IPA vapor drying technique.

9. A method for cleaning a semiconductor wafer in a multi-bath process according to claim 2 wherein said third cleaning solution comprises less than 1 volume % HF in DI water.

* * * * *